(12) United States Patent
Hwang et al.

(10) Patent No.: US 8,344,662 B2
(45) Date of Patent: Jan. 1, 2013

(54) LIGHT EMITTING DIODE DRIVER

(75) Inventors: Bo Hyun Hwang, Seoul (KR); Jae Shin Lee, Gyunggi-do (KR); Jung Hyun Kim, Gyunggi-do (KR); Jung Sun Kwon, Gyunggi-do (KR); Seung Kon Kong, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 162 days.

(21) Appl. No.: 12/885,903

(22) Filed: Sep. 20, 2010

(65) Prior Publication Data

US 2011/0156606 A1    Jun. 30, 2011

(30) Foreign Application Priority Data

Dec. 24, 2009   (KR) .................. 10-2009-0130816

(51) Int. Cl.
  *G05F 1/00* (2006.01)
(52) U.S. Cl. ........................................ 315/307
(58) Field of Classification Search .................. 315/291, 315/307, 308, 312, 185 S, 185 R, 227 R, 315/224, 246, 247
  See application file for complete search history.

(56) References Cited

U.S. PATENT DOCUMENTS

| 7,265,504 | B2 * | 9/2007 | Grant .......................... 315/308 |
| 7,511,436 | B2 * | 3/2009 | Xu .............................. 315/307 |
| 7,671,575 | B1 * | 3/2010 | Suzuki et al. ................. 323/285 |
| 7,919,928 | B2 * | 4/2011 | Ziegenfuss ................ 315/227 R |

FOREIGN PATENT DOCUMENTS

| KR | 10-2006-0017360 | 2/2006 |
| KR | 10-2008-0034327 | 4/2008 |

OTHER PUBLICATIONS

Korean Office Action, with English translation, issued in Korean Patent Application No. 10-2009-0130816, mailed Apr. 14, 2011.

* cited by examiner

*Primary Examiner* — Minh D A
(74) *Attorney, Agent, or Firm* — McDermott Will & Emery LLP

(57) ABSTRACT

There is provided a light emitting diode (LED) driver removing signal interference by varying a switching frequency within a preset range. The LED driver includes a power supply section switching input power and supplying driving power to at least one LED; a switching control section controlling the switching of the power supply section according to a clock signal being supplied; and a clock signal generation section supplying the clock signal having a preset variable frequency range to the switching control section.

7 Claims, 5 Drawing Sheets

LIGHT EMITTING DIODE DRIVER

CROSS-REFERENCE TO RELATED APPLICATIONS

This application claims the priority of Korean Patent Application No. 10-2009-0130816 filed on Dec. 24, 2009, in the Korean Intellectual Property Office, the disclosure of which is incorporated herein by reference.

BACKGROUND OF THE INVENTION

1. Field of the Invention

The present invention relates to alight emitting diode driver, and more particularly, to a light emitting diode driver removing signal interference by varying a switching frequency within a preset range.

2. Description of the Related Art

In recent years, new flat panel display (FPD) technologies, reflecting the demand for high resolution, large-sized screens and the like in the present multimedia age, have become prominent in the display industry. Particularly, in the case of a medium- and large-sized display, a Liquid Crystal Display (LCD) TV has shown a rapid growth and an LCD monitor has been adopted in laptop computers, and accordingly, an LCD has been expected to grow in prominence henceforth, in view of price and marketability.

A Cold Cathode Fluorescent Lamp (CCFL) has been used as a backlight light source in an LCD TV or a notebook according to the related art. In recent years, however, the use of a Light Emitting Diode (LED) has been gradually increased due to various advantages including power consumption, life span and environmentally friendly characteristics.

In the case of a medium- and large-sized display, such an LED includes a plurality of LED channels. In order to control each of the LED channels with a constant current, a switch device that supplies current to the LED channels according to a preset switching frequency is used.

However, a constant frequency of the switch device may generate harmonic waves, such that signal interference caused by the harmonic waves may cause a system malfunction problem.

SUMMARY OF THE INVENTION

An aspect of the present invention provides a light emitting diode driver removing signal interference by varying a switching frequency within a preset range.

According to an aspect of the present invention, there is provided a light emitting diode (LED) driver including: a power supply section switching input power and supplying driving power to at least one LED; a switching control section controlling the switching of the power supply section according to a clock signal being supplied; and a clock signal generation section supplying the clock signal having a preset variable frequency range to the switching control section.

The clock signal generation section may include a triangular wave signal generating part generating a triangular wave signal in a preset voltage range; and an oscillating part oscillating the clock signal having the preset variable frequency range, the variable frequency range being set according to the triangular wave signal of the triangular wave signal generating part.

The triangular wave signal generating part may include a first current mirror portion mirroring a current of a preset reference power so that first and second current sources are supplied; and a charge/discharge portion charging and discharging the first and second current sources of the first current mirror portion in the preset voltage range so that the triangular wave signal is supplied.

The oscillating part may include a second current mirror portion mirroring a current of a preset reference power according to the triangular wave signal; and a clock signal generation portion generating the clock signal by charging and discharging a voltage of the current mirrored by the second current mirror portion and a current mirrored according to a logical result of a preset reference voltage.

The switching control section may include a comparator comparing a feedback signal obtained by detecting the driving power supplied to the at least one LED by the power supply section with a reference signal and supplying a Pulse Width Modulation (PWM) signal; and a gate driver controlling the switching of the power supply section according to the PWM signal supplied by the comparator.

The power supply section may supply the driving power to a plurality of parallel-connected LEDs.

The power supply section may supply the driving power to at least one LED array including a plurality of series-connected LEDs.

The power supply section may supply the driving power to a plurality of parallel-connected LED arrays.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
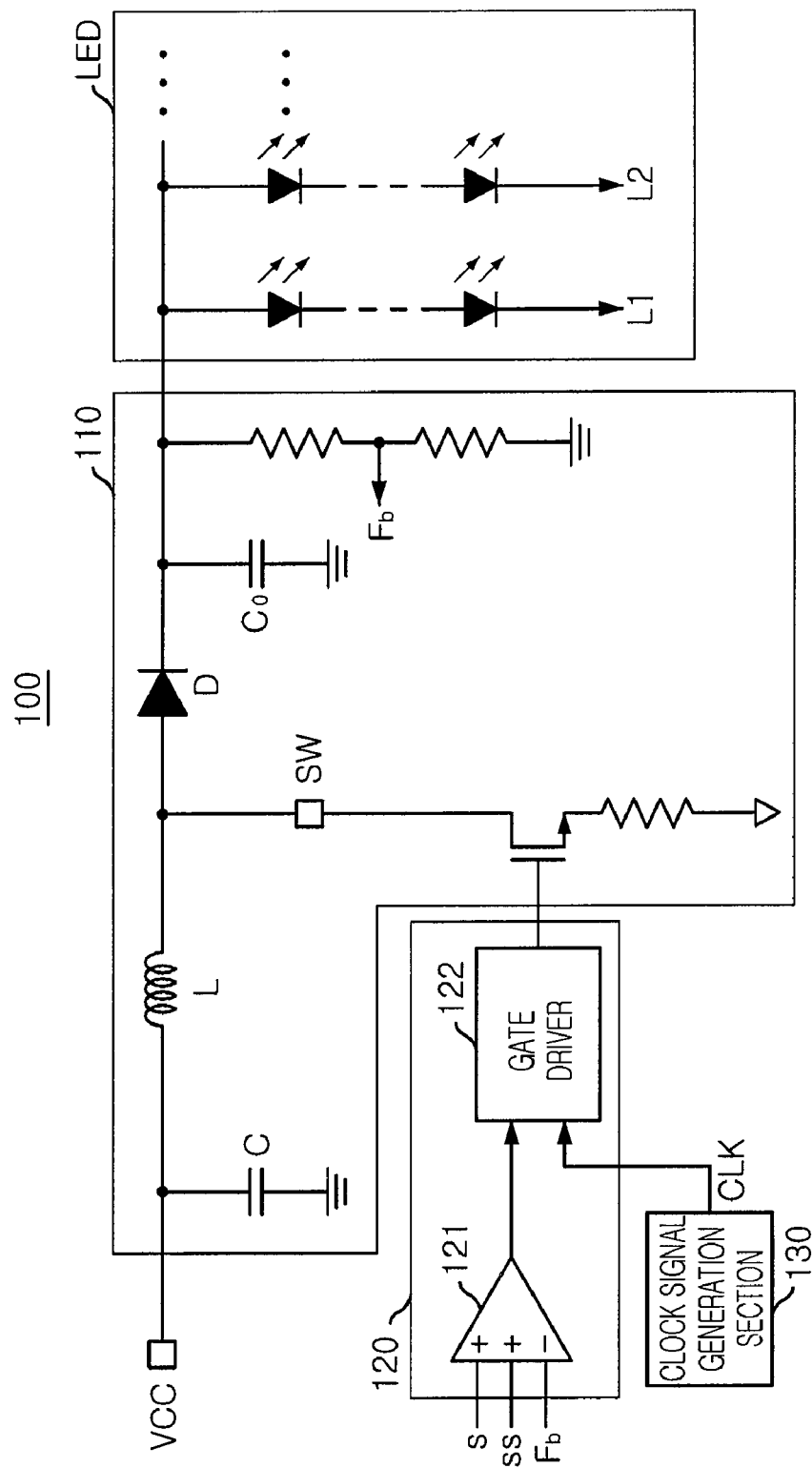
FIG. 1 is a schematic view illustrating a configuration of a light emitting diode (LED) driver according to an exemplary embodiment of the present invention.

FIG. 1 is a schematic view illustrating a configuration of a light emitting diode (LED) driver according to an exemplary embodiment of the present invention.

Referring to FIG. 1, an LED driver 100 according to this embodiment may include a power supply section 110, a switching control section 120, and a clock signal generation section 130.

The power supply section 110 switches input power VCC, converts the switched input power into driving power capable of driving at least one LED, and supplies the driving power to the at least one LED.

The at least one LED may include a plurality of parallel-connected LEDs. The at least one LED may include at least one LED array including a plurality of series-connected LEDs. A plurality of LED arrays L1 and L2 may be connected in parallel. This LED may emit light by being supplied with the driving power.

The input power VCC may be filtered by an inductor L and a capacitor C, be switched by a switch SW, be stabilized by a diode D and an output capacitor Co, and be supplied to the at least one LED.

The switching control section 120 may control the switching of the switch SW of the power supply section 110. In this regard, the switching control section 120 may include a comparator 121 and a gate driver 122.

The comparator 121 may compare a control signal S input from the outside with a feedback signal Fb obtained by the division and feedback of power supplied to the at least one LED, and transmit a comparison result to the gate driver 122. In addition, the comparator 121 may be supplied with a soft start signal SS from the outside.

The gate driver 122 may control the switching of the switch SW using a Pulse Width Modulation (PWM) method according to the comparison result supplied by the comparator 121 and a clock signal CLK. When a frequency of a switch control signal controlling the switch SW is constant, signal interference may occur. Accordingly, the clock signal CLK may have a preset variable frequency range.

The clock signal generation section 130 supplies the clock signal CLK having the preset variable frequency range to the gate driver 122.

Hereinafter, a detailed configuration of the clock signal generation section 130 will be described with reference to the accompanying drawings.

Figure 2:
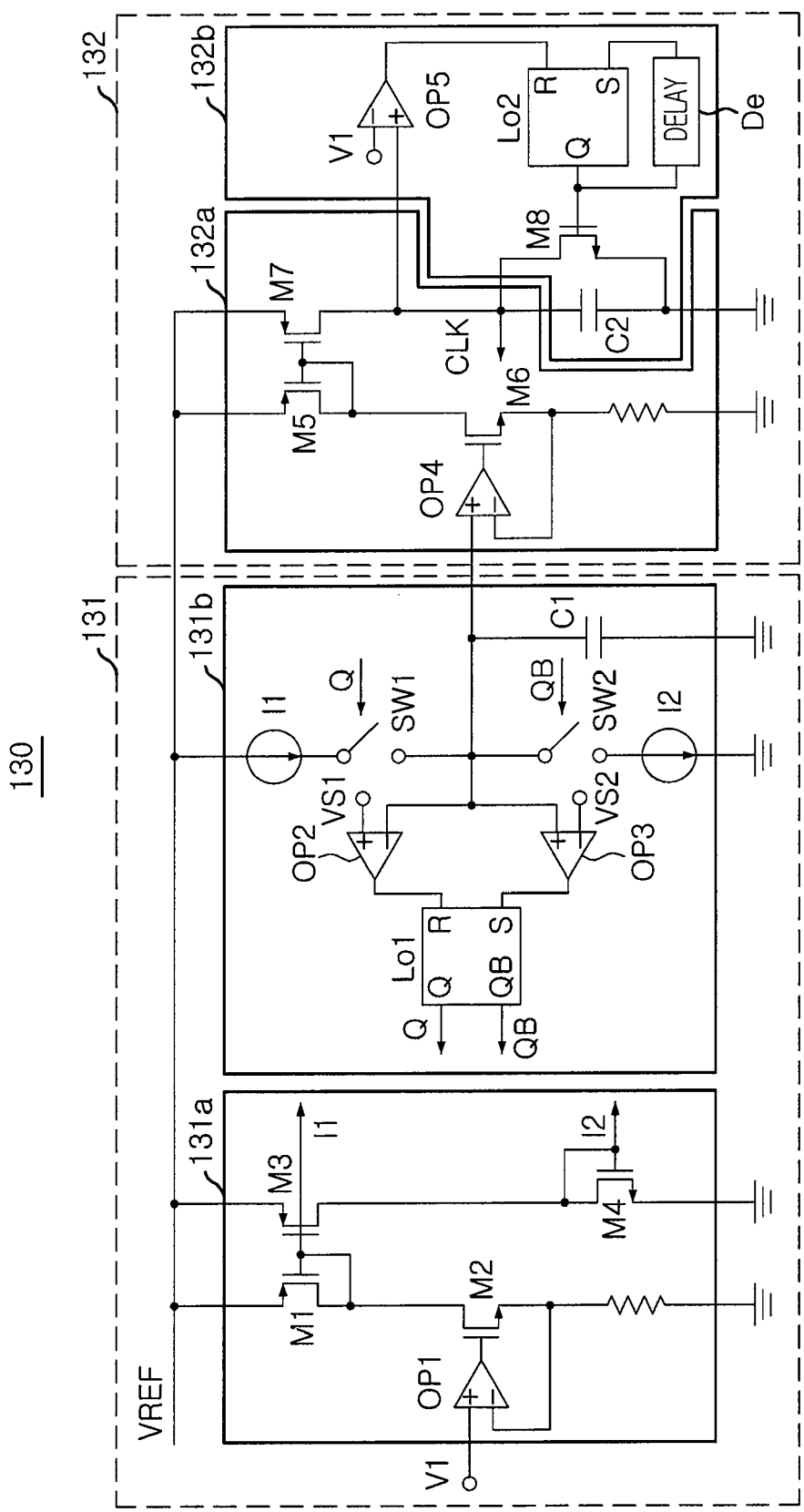
FIG. 2 is a schematic view illustrating a configuration of a clock signal generation section adopted in an LED driver according to an exemplary embodiment of the present invention.

FIG. 2 is a schematic view illustrating a configuration of a clock signal generation section adopted in an LED driver according to an exemplary embodiment of the present invention.

The clock signal generation section 130 may include a triangular wave signal generating part 131 and an oscillating part 132.

The triangular wave signal generating part 131 may include a first current mirror portion 131a and a charge/discharge portion 131b.

The first current mirror portion 131a may include two p-channel metal oxide semiconductor (PMOS) transistors M1 and M3, two n-channel metal oxide semiconductor (NMOS) transistors M2 and M4, and a single operational amplifier (OP Amp) OP1.

A first PMOS transistor M1 and a first NMOS transistor M2 may be connected in series. A second PMOS transistor M3 and a second NMOS transistor M4 may be connected in series.

The first PMOS transistor M1 may switch a reference power VREF being supplied. The first NMOS transistor M2 may switch the current flowing through the first PMOS transistor M1 according to a reference voltage V1 of the first OP Amp OP1.

The second PMOS and NMOS transistors M3 and M4 may perform the mirroring of the current flowing through the first PMOS transistor M1 and provide the mirrored current as respective current sources I1 and I2.

The charge/discharge portion 131b may switch the current sources I1 and I2 according to a logical result and charge and discharge the switched current sources I1 and I2, so that a triangular wave signal is supplied.

The charge/discharge portion 132b may include a first RS latch Lo1, second and third OP Amps OP2 and OP3, the first and second current sources I1 and I2, first and second switches SW1 and SW2, and a first capacitor C1.

The first RS latch Lo1 may supply switch signals Q and QB according to logical operations. The first current source I1, the first switch SW1, the second switch SW2 and the second current source I2 may be sequentially connected in series between the reference power VREF and a ground. The first and second switches SW1 and SW2 may switch current paths of the first and second current sources I1 and I2 according to the switch signals Q and QB. The first capacitor C1 is charged and discharged according to the above-described switching of the first and second switches SW1 and SW2.

Here, a voltage charged in the first capacitor C1 may be variable within a preset voltage range of VS1 to VS2. The variations of the voltage may be determined by the second and third OP Amps OP2 and OP3. The first RS latch Lo1 may perform a logical operation according to a comparison result of the second and third OP Amps OP2 and OP3, thereby supplying the switch signals Q and QB.

The oscillating part 132 may include a second current mirror portion 132a and a clock signal generation portion 132b.

The second current mirror portion 132a may include two PMOS transistors M5 and M7, a single NMOS transistor M6, and a single OP Amp OP4.

A third PMOS transistor M5 and a third NMOS transistor M6 may be connected in series. A fourth PMOS transistor M7 may be connected in parallel with the third PMOS transistor M5.

The third PMOS transistor M5 may switch the reference power VREF being supplied. The third NMOS transistor M6 may switch the current flowing through the third PMOS transistor M5 according to a voltage of the fourth OP Amp OP4. Here, a voltage having a variable level by being charged and discharged by the first capacitor C1 may be supplied to the fourth OP Amp OP4.

By the mirroring of the current flowing through the third PMOS transistor M5, the fourth PMOS transistor M7 may receive the mirrored current.

The clock signal generation portion 132b may include a fifth OP Amp OP5, a second RS latch Lo2, a delay De, a fourth NMOS transistor M8, and a second capacitor C2.

The fourth NMOS transistor M8 and the second capacitor C2 are connected in parallel, and they are connected in series with the fourth PMOS transistor M7. Accordingly, the fourth NMOS transistor M8 may switch the current flowing through the fourth PMOS transistor M7. The second capacitor C2 may be subject to the charge and discharge of the current input from the fourth PMOS transistor M7 according to the switching of the fourth NMOS transistor M8 so that a clock signal CLK may be supplied.

The fifth OP Amp OP5 compares a level of the voltage of the clock signal CLK charged and discharged in the second capacitor C2 with that of a reference voltage V1, and transmits a comparison result to the second RS latch Lo2. The second RS latch Lo2 may perform a logical operation on the comparison result of the fifth OP Amp OP5 and its own output Q delayed by the delay De, thereby controlling the switching of the fourth NMOS transistor M8.

Figure 3:
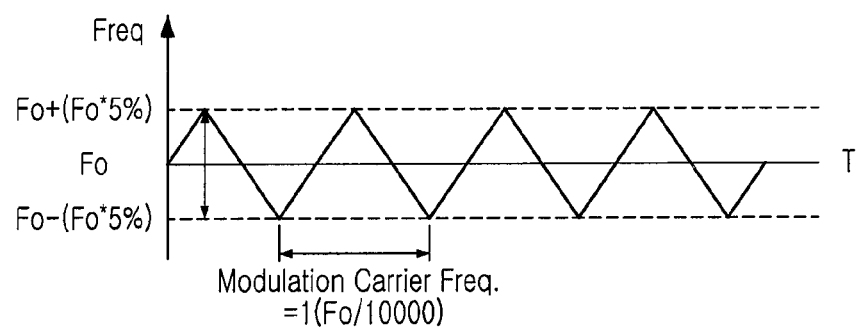
FIGS. 3 and 4 are graphs illustrating the frequency and cycle of a clock signal generation section according to an exemplary embodiment of the present invention.
Figure 4:
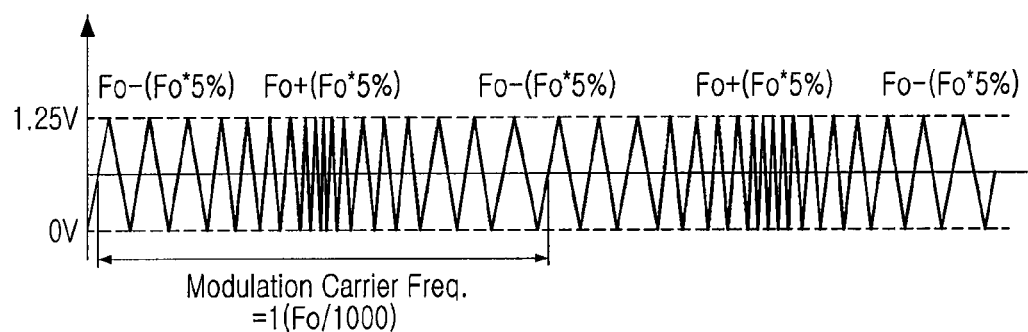
Figure 5A:
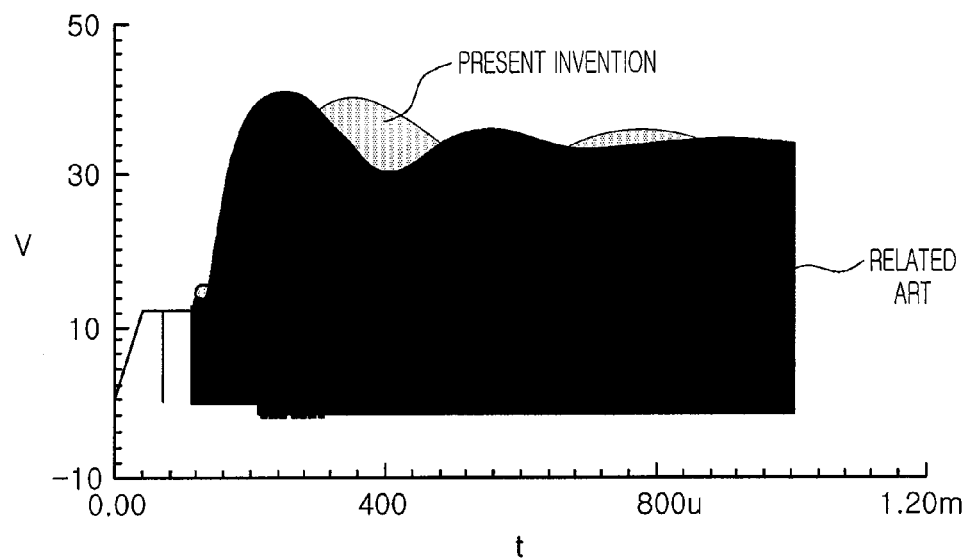
FIGS. 5A through 5D are graphs illustrating the electrical characteristics of an LED driver according to an exemplary embodiment of the present invention by comparing with an LED driver according to the related art.
Figure 5B:
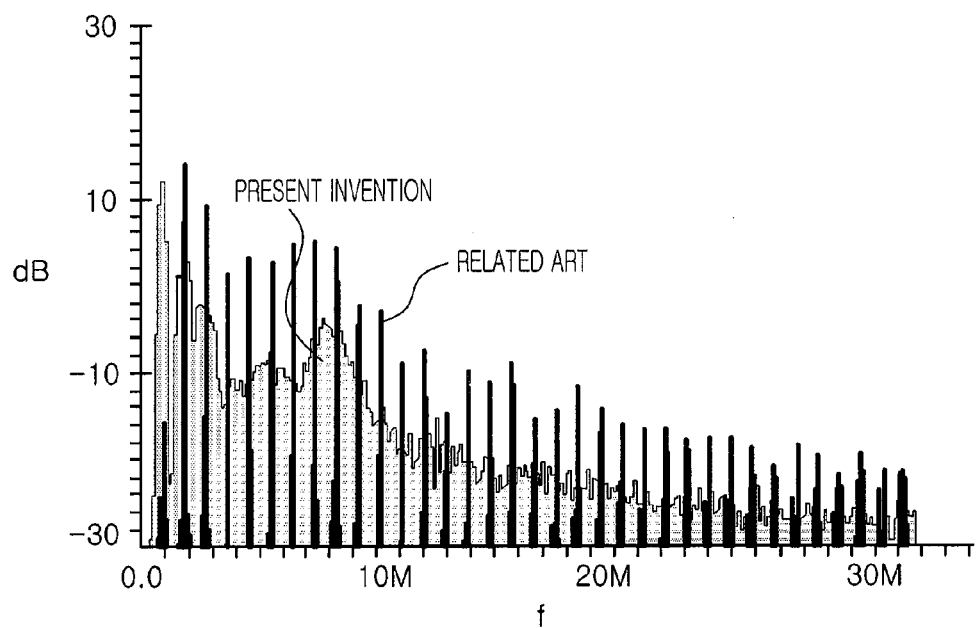
Figure 5C:
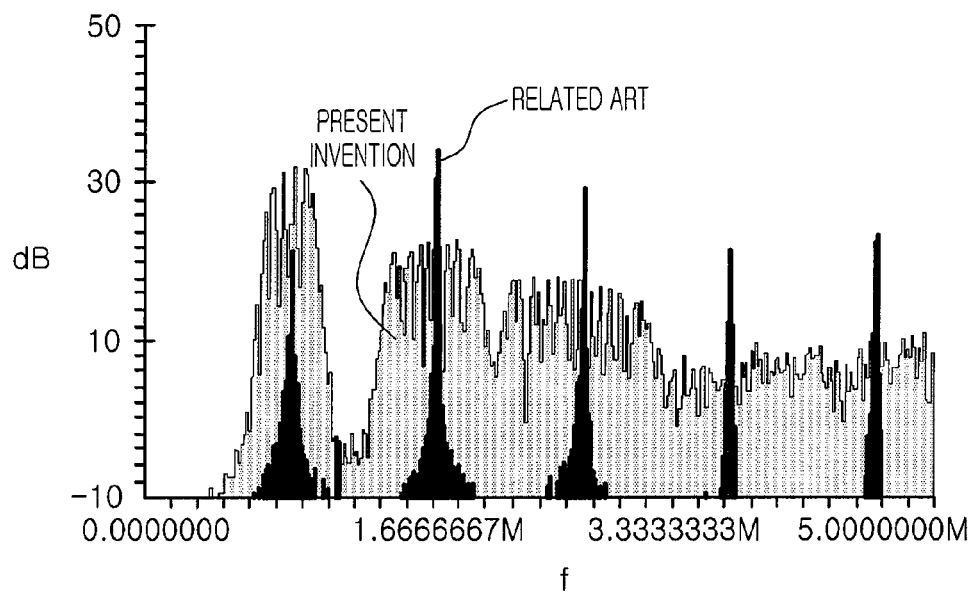
Figure 5D:
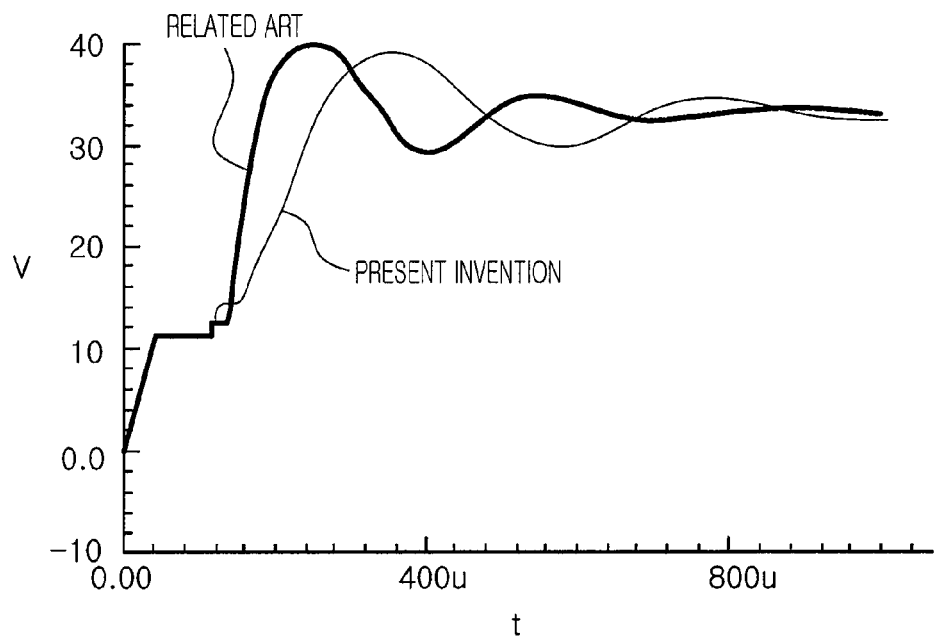

FIGS. 3 and 4 are graphs illustrating the frequency and cycle of a clock signal generation section according to an exemplary embodiment of the present invention.

As shown in FIGS. 3 and 4, a clock signal CLK supplied by the clock signal generation section 130 has a preset variable frequency and cycle range. Here, the frequency of the clock signal CLK may be set to ±5% of a desired frequency Fo in order not to deteriorate an LED driving function, and the cycle of the clock signal CLK may be set to $\frac{1}{1000}$.

FIGS. 5A through 5D are graphs illustrating the electrical characteristics of an LED driver according to an exemplary embodiment of the present invention by comparing with an LED driver according to the related art.

Referring to FIGS. 5A through 5D, an LED driver according to an embodiment of the present invention supplies a clock signal having a preset variable frequency range, a switching frequency is varied accordingly. Thus, signal interference is reduced, and accordingly, harmonic waves are reduced.

As described above, a clock signal having a preset variable frequency range is provided so that a switching frequency is varied accordingly, and signal interference is thus reduced. Therefore, there is no need for an additional shielding portion in order to remove signal interference. As a result, miniaturization and a reduction in production costs may be achieved.

As set forth above, according to exemplary embodiments of the invention, signal interference is removed by varying a switching frequency within a preset range so that LED driving may be stabilized.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting diode (LED) driver, comprising:
    a power supply section configured to switch input power and supply driving power to at least one LED;
    a switching control section configured to control the switching of the power supply section according to a clock signal being supplied; and
    a clock signal generation section configured to supply the clock signal having a preset variable frequency range to the switching control section, wherein the clock signal generation section comprises:
        a triangular wave signal generating part configured to generate a triangular wave signal in a preset voltage range; and
        an oscillating part configured to oscillate the clock signal having the preset variable frequency range, the preset variable frequency range being set according to the triangular wave signal generated by the triangular wave signal generating part.

2. The LED driver of claim 1, wherein the triangular wave signal generating part comprises:
    a first current mirror portion configured to mirror a current of a preset reference power to supply first and second current sources; and
    a charge/discharge portion configured to charge and discharge the first and second current sources supplied by the first current mirror portion in the preset voltage range so that the triangular wave signal is supplied.

3. The LED driver of claim 1, wherein the oscillating part comprises:
    a second current mirror portion configured to mirror a current of a preset reference power according to the triangular wave signal; and
    a clock signal generation portion configured to generate the clock signal by charging and discharging a voltage of the current mirrored by the second current mirror portion and a current mirrored according to a logical result of a preset reference voltage.

4. The LED driver of claim 1, wherein the switching control section comprises:
    a comparator configured to compare a feedback signal obtained by detecting the driving power supplied to the at least one LED by the power supply section with a reference signal and supply a Pulse Width Modulation (PWM) signal; and
    a gate driver configured to control the switching of the power supply section according to the PWM signal supplied by the comparator.

5. The LED driver of claim 1, wherein the power supply section supplies the driving power to a plurality of parallel-connected LEDs.

6. The LED driver of claim 1, wherein the power supply section supplies the driving power to at least one LED array including a plurality of series-connected LEDs.

7. The LED driver of claim 6, wherein the power supply section supplies the driving power to a plurality of parallel-connected LED arrays.

* * * * *